United States Patent
Fujimoto et al.

(12) 
(10) Patent No.: US 6,242,761 B1
(45) Date of Patent: *Jun. 5, 2001

(54) NITRIDE COMPOUND SEMICONDUCTOR LIGHT EMITTING DEVICE

(75) Inventors: Hidetoshi Fujimoto, Kawasaki; John Rennie, Tokyo-To; Masahiro Yamamoto, Kawasaki; Masayuki Ishikawa, Yokohama; Shinya Nunoue, Ichikawa; Lisa Sugiura, Kawasaki, all of (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/026,941

(22) Filed: Feb. 20, 1998

(30) Foreign Application Priority Data

Feb. 21, 1997 (JP) .................................................. 9-037291
Feb. 18, 1998 (JP) ................................................ 10-036263

(51) Int. Cl.$^7$ .................................................. H01L 29/72
(52) U.S. Cl. .............................. 257/94; 257/98; 257/102; 257/103; 257/618
(58) Field of Search ............................... 257/94, 98, 102, 257/103, 618

(56) References Cited

U.S. PATENT DOCUMENTS

| | | | | |
|---|---|---|---|---|
| 5,023,199 | * | 6/1991 | Murakami et al. | 437/167 |
| 5,488,234 | * | 1/1996 | Yoshii et al. | 257/94 |
| 5,565,694 | * | 10/1996 | Huang et al. | 257/97 |
| 5,585,649 | * | 12/1996 | Ishikawa et al. | 257/94 |
| 5,693,963 | * | 12/1997 | Fujimoto et al. | 257/94 |
| 5,717,226 | * | 2/1998 | Lee et al. | 257/56 |
| 5,733,796 | * | 3/1998 | Manabe et al. | 437/127 |
| 5,767,536 | * | 6/1998 | Murakami et al. | 257/99 |
| 5,780,873 | * | 7/1998 | Itaya et al. | 257/521 |
| 5,789,768 | * | 8/1998 | Lee et al. | 257/96 |
| 5,814,839 | * | 9/1998 | Hosoba | 257/96 |
| 5,821,555 | * | 10/1998 | Saito et al. | 257/13 |
| 5,877,558 | * | 3/1999 | Nakamura et al. | 257/749 |

FOREIGN PATENT DOCUMENTS

| | | | |
|---|---|---|---|
| 361294886 | * | 12/1986 | (JP) . |
| 3-218625 | | 9/1991 | (JP) . |
| 4-213878 | | 8/1992 | (JP) . |
| 4-242985 | | 8/1992 | (JP) . |
| 5-183189 | | 7/1993 | (JP) . |
| 7-240508 | | 9/1995 | (JP) . |
| 8-18159 | | 1/1996 | (JP) . |
| 8-46291 | | 2/1996 | (JP) . |
| 8-107247 | | 4/1996 | (JP) . |
| 8-111558 | | 4/1996 | (JP) . |
| 8-88441 | | 4/1996 | (JP) . |
| 8-274372 | | 10/1996 | (JP) . |
| 8-330678 | | 12/1996 | (JP) . |
| 9-45962 | | 2/1997 | (JP) . |

* cited by examiner

*Primary Examiner*—Edward Wojciechowicz
(74) *Attorney, Agent, or Firm*—Oblon, Spivak, McClelland, Maier & Neustadt, P.C.

(57) ABSTRACT

In order to remove the problems in conventional nitride compound semiconductor laser structures, namely, high operation voltage caused by a high resistance in a p-type layer and a high contact resistance of an electrode, damage to the crystal caused by dry etching, insufficient current injection, and the need for a high current density, a nitride compound semiconductor light emitting device has current blocking layers made of n-type $B_{(1-x-y-z)}In_xAl_yGa_zN$ ($0 \leq x \leq 1$, $0 \leq y \leq 1$, $0 \leq z \leq 1$) single crystal containing an oxide of a predetermined metal, carbon and impurities exhibiting p-type and n-type conductivity, or i-type $B_{(1-x-y-z)}In_xAl_yGa_zN$ ($0 \leq x \leq 1$, $0 \leq y \leq 1$, $0 \leq z \leq 1$) single crystal in which carriers are inactivated by hydrogen or oxygen to realize an internal current blocking structure without the need for dry etching. By applying a reverse bias voltage, the semiconductor can be activated only along a current path, and the remainder region is utilized as a current blocking layer. When the n-side electrode has a unique three-layered structure, a reduction in contact resistance and good wire bonding are promised.

19 Claims, 6 Drawing Sheets

NITRIDE COMPOUND SEMICONDUCTOR LIGHT EMITTING DEVICE

BACKGROUND OF THE INVENTION

1. Field of the Invention

This invention relates to a semiconductor light emitting device made of nitride compound semiconductors.

2. Description of the Related Art

GaN and other nitride compound semiconductors have recently been remarked as materials of light emitting diodes or semiconductor lasers for emitting blue to ultraviolet light. For example, gallium nitride compound semiconductors, having a direct transition band structure, are recognized to exhibit a high emission efficiency. Additionally, blue semiconductor laser diodes and semiconductor light emitting diodes using these compounds are expected to be applicable as light sources for high-density information processing or other various display light sources because of their short pulsation wavelengths.

In this application, the term "nitride compound semiconductor" pertains to any III-V compound semiconductor expressed as $B_x In_y Al_z Ga_{(1-x-y-z)} N$ ($0 \leq x \leq 1$, $0 \leq y \leq 1$, $0 \leq z \leq 1$) containing phosphorus (P), arsenic (As) and/or others in addition to N as group-V elements, and also pertains to any II-IV-$N_2$-type compound such as $BeCN_2$.

In order to induce pulsation of a semiconductor laser with a low threshold value or to induce emission of a light emitting diode with a high luminance, it is important to suppress the flow of a current into a region not contributing to emission of light. For example, in semiconductor lasers, laser pulsation does not occur unless the current is supplied into a bottle-neck portion in the current layer. In light emitting diodes, by suppressing the flow of a current into a luminous region blocked by a wire bonding or another electrode, a certain luminance is obtained with a low current.

In this respect, various proposals have been made on current blocking structures. Among them, Japanese Patent Laid-Open Publications Nos. 4-242985 and 4-213878 disclose semiconductor lasers in which a stripe-shaped electrode is in direct contact with GaN compound crystal. In these structures, since a p-type layer with a relatively high resistance contacts with the electrode with a high contact resistance over small area, the resistance between the p-type electrode and the p-type layer is large, and this results in increasing the resistance and the operation voltage of the entire device. Therefore, an internal current blocking structure permitting a wide extension of the p-type layer is required to decrease the operation voltage.

Also on the problem, some proposals have been made. Japanese Patent Laid-Open Publication No 8-18159 teaches hydrogen implantation to make carriers inactive. Mere implantation, however, causes damage to the crystal, and annealing or other processing must be done to recover the crystallographic structure. However, such processing causes the implanted hydrogen to separate from the crystal, thereby permits the carriers to restore activity, and fails to effectuate the current confining function.

Japanese Patent Laid-Open Publications Nos. 8-46291, 8-88441, 8-107247 and 8-111558 teach current blocking structures made by forming in a p-type crystal layer a portion of a different conduction type or an insulating layer such as $SiO_2$ film. These techniques rely on selectively etching a grown crystal. GaN compound crystal, however, is difficult to etch by a wet method using a solution, and compels one to use dry etching by various gases. Dry etching, however, causes damage to the surface of a non-etched region, and hence causes a current leakage. The current leakage makes current injection into the active layer inefficient, and therefore disturbs laser pulsation under a low threshold current density.

That is, any conventional structure made by using dry etching or ion implantation, damages to crystals may cause a current leakage. Such current leakage makes current injection into the active layer inefficient, which results in preventing laser pulsation under a low threshold current density or realization of a highly efficient light emitting diode.

On the other hand, in light emitting devices using nitride compound semiconductors, n-type layers and p-type layers are grown on a sapphire substrate in this order, interposing a buffer layer between them, and the electrode to the n-type layer is formed after removing the p-type layers by etching. There are various proposals on the electrode to the n-type layers. For example, Japanese Patent Laid-Open Publication No. 3-252175 discloses aluminum (Al). The use of aluminum, however, invites decomposition or deterioration during various annealing steps after deposition of the electrode, and degrades wire bonding.

Japanese Patent Laid-Open Publication No. 7-240508 teaches stacking gold (Au) on an Al electrode to facilitate wire bonding. However, the Inventors have experimentally recognized that deterioration or decomposition still remains unsolved because Au and Al are mixed or oxidized during annealing. As a countermeasure against this problem, insertion of Ti as a barrier metal is disclosed in Japanese Patent Laid-Open Publication No 8-274372. However, the Inventors have experimentally found that this approach certainly made wire bonding possible, but invited an increase in contact resistance of the electrode.

That is, conventional electrode structure of nitride compound semiconductor light emitting devices fails to decrease the contact resistance and cannot ensure good wire bonding.

SUMMARY OF THE INVENTION

As discussed above, conventional nitride compound semiconductor light emitting devices involve the problems, namely, inefficient current injection into the active layer, and difficulty in laser pulsation under a low threshold current density or in realization of a highly efficient emission of a light emitting diode. Additionally, electrode structures in conventional nitride compound semiconductor light emitting devices fail to decrease the contact resistance and cannot ensure good wire bonding.

It is therefore an object of the invention to provide a nitride compound semiconductor light emitting device ensuring efficient current injection into an active layer, and promising laser pulsation under a low threshold current density or highly efficient emission of a light emitting diode.

Another object of the invention is to provide a nitride compound semiconductor light emitting device having a low contact resistance and enable good wire bonding.

Summarizing various modes of the invention, features of the invention lie in the following points.

First of all, a nitride compound semiconductor light emitting device according to the invention makes it possible to make an internal current blocking structure without the need for dry etching of the crystal, and includes current blocking layers. The current blocking layers are any of:

(1) an oxide of (at least) a metal selected from the group consisting of titanium (Ti), magnesium (Mg), nickel (Ni), chromium (Cr), scandium (Sc,) zinc (Zn), indium (In), tin (Sn) and tungsten (W);

(2) carbon;

(3) n-type $B_{(1-x-y-z)}In_xAl_yGa_zN$ single-crystal layers ($0 \leq x \leq 1$, $0 \leq y \leq 1$, $0 \leq z \leq 1$) containing an impurity exhibiting a p-type conductivity and an impurity exhibiting an n-type conductivity; or (4) i-type $B_{1-x-y-z)}In_xAl_yGa_zN$ single-crystal layers ($0 \leq x \leq 1$, $0 \leq y \leq 1$, $0 \leq z \leq 1$) in which carriers are inactivated by hydrogen or oxygen.

According to another aspect of the invention, the current blocking layers are formed selectively on a conductive layer, and formed on the current blocking layers are a buffer layer made of $B_{(1-x-y-z)}In_xAl_yGa_zN$ ($0 \leq x \leq 1$, $0 \leq y \leq 1$, $0 \leq z \leq 1$) and a layer made of $B_{(1-x2-y2-z2)}In_{x2}Al_{y2}Ga_{z2}N$ ($0 \leq x2 \leq 1$, $0 \leq y2 \leq 1$, $0 \leq z2 \leq 1$) stacked on the buffer layer.

According to another aspect of the invention, a nitride compound semiconductor light emitting device is configured to include an emission layer sandwiched between a p-type cladding layer and an n-type cladding layer to make an internal current blocking structure without the need for etching, in which, by applying a reverse bias voltage is applied such that the voltage of a p-side electrode is negative and the voltage of the n-side electrode is positive, a low resistance region is formed along the current path, and both the p-type cladding layers and n-type cladding layers have formed current blocking regions.

According to another aspect of the invention, a nitride compound semiconductor light emitting device has an n-side electrode including at three stacked layers, in which a first layer in contact with said n-type nitride compound semiconductor contains as its major component any metal selected from the group consisting of aluminum (Al), silver (Ag) and copper (Cu); a second layer formed on said first layer contains as its major component at least one metal selected from the group consisting of platinum (Pt), palladium (Pd), chromium (Cr), molybdenum (Mo) and tungsten (W); and a third layer formed on said second layer to appear externally contains as its major component any one selected from the group consisting of gold (Au) and aluminum (Al).

According to the invention, a nitride compound semiconductor laser operation under a low threshold current density or a light emitting diode with a high efficiency can be realized, since an internal current blocking structure with a high current injection efficiency can be realized without using dry etching which often causes damage to crystals. The nitride compound semiconductor laser is usable as a light source of a next-generation high-definition DVD (digital versatile disc) by adjusting the pulsation wavelength within the range of 400 to 430 nm, and can supply a power as large as 30 mW or more especially required for writing.

Additionally, according to the invention, by applying a reverse bias voltage, cladding layers including each current blocking region on and under the active layer can be made, and laser pulsation under a low threshold value is possible.

Moreover, according to the invention, by using a unique multi-layered n-type electrode, a nitride compound semiconductor light emitting device with a low contact resistance and promising good wire bonding can be realized. That is, the threshold current density is decreased in a semiconductor laser, and the operation voltage is decreased in a light emitting diode. As a result, the invention not only prevents deterioration of electrodes, but also alleviates deterioration of the light emitting device itself, and thereby significantly improves the reliability of the device.

DETAILED DESCRIPTION OF THE PREFERRED EMBODIMENTS

Explained below are embodiments of the invention with reference to the drawings.

(First Embodiment)

Figure 1:
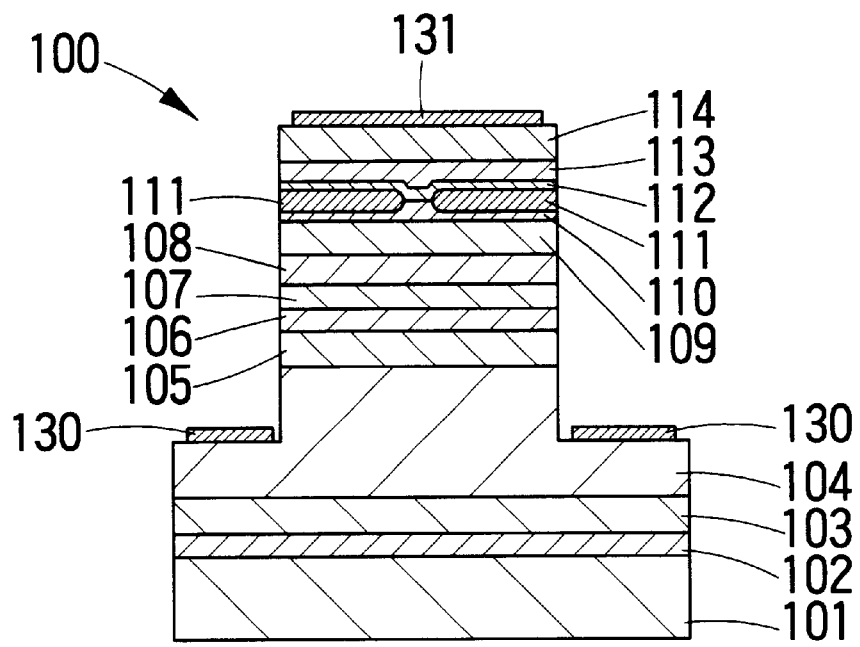
FIG. 1 is a diagram showing a cross-sectional structure of a nitride compound semiconductor light emitting device according to the first embodiment of the invention.

FIG. 1 shows a cross-sectional structure of a semiconductor laser 100 taken as the first embodiment of the invention. The semiconductor laser 100 has a sapphire substrate 101 having a c-plane as its major surface, and a laser structure of nitride compound semiconductors is formed on the substrate 101. More specifically, stacked on the substrate 101 are, sequentially, a GaN buffer layer 102, undoped GaN layer 103, n-type GaN contact layer 104, n-type AlGaN cladding layer 105, n-type GaN guide layer 106, multi-quantum well active layer 107, p-type GaN guide layer 108, p-type AlGaN cladding layer 109, p-type GaN layer 110, $TiO_2$ layer 111, p-type GaN layer 112, p-type GaN layer 113, and p-type GaN contact layer 114. An n-side electrode 130 is formed on the n-type contact layer 104, and a p-side electrode 131 is formed on the p-type contact layer 114.

The $TiO_2$ film 111 is a current blocking layer mainly dealt with in the present invention. In this embodiment, the current blocking layer is an oxide film of titanium. By using the $TiO_2$ film as the current blocking layer, electric current can be injected into the active layer 107 with a higher efficiency than conventional devices, and laser pulsation is possible under a low threshold current density.

Explained below is a method for manufacturing the semiconductor laser 100 successively.

The semiconductor laser 100 according to the embodiment was made by using metal organic chemical vapor deposition (MOCVD), using trimethylgallium (TMG), trimethylaluminum (TMA), trimethylindium (TMI) and bis-cyclopentadienile magnesium ($Cp_2Mg$) which are organic metal source materials, and ammonia and silane which are gas source materials. Also used are hydrogen and nitrogen as carrier gases.

First introduced is the sapphire substrate 101, after being cleaned by an organic solvent or acid, into a reactor of an MOCVD system, and put on a susceptor to be heated by radio-frequency waves. While supplying hydrogen in the flow rate of 10 L/min under the atmospheric pressure, the substrate 101 undergoes vapor-phase etching at the temperature of 1100° C. for approximately 10 minutes to remove a native oxide from its surface.

Then, the temperature of the sapphire substrate 101 is decreased to 530° C., and the GaN buffer layer 102 of a thickness around 50 nm is stacked by supplying hydrogen in the flow rate of 15 L/min, nitrogen in 5 L/min, ammonia in 10 L/min and TMG in 25 cc/min for approximately four minutes.

The sapphire substrate 101 is next heated to 1100° C. while supplying hydrogen in the flow rate of 15 L/min, nitrogen in 5 L/min and ammonia in 10 L/min, and the undoped GaN layer 103 of a thickness around 2 μm is stacked while supplying hydrogen in 15 L/min, nitrogen of 5 L/min, ammonia in 10 L/min and TMG in 100 cc/min for 60 minutes.

Then, additionally supplying hydrogen-diluted 10 ppm $SiH_4$ of the flow rate of 3 cc/min for approximately 130 minutes, the n-type GaN layer 104 of a thickness around 4 μm is stacked. Then, also supplying TMA of 50 cc/min in addition to these source materials for approximately 10 minutes, the n-type AlGaN cladding layer 105 is stacked by a thickness of approximately 0.2 μm.

Then, maintaining the sapphire substrate 101 at 1100° C., and supplying hydrogen in the flow rate returned to 15 L/min, nitrogen to 5 L/min for nitrogen, ammonia to 10 L/min and TMG to 100 cc/min for three minutes, the GaN guide layer 106 of a thickness around 0.1 μm is stacked.

Then, the temperature of the sapphire substrate 101 is decreased to 800° C. in three minutes while supplying nitrogen in the flow rate of approximately 20 L/min and ammonia in 10 L/min. Maintaining the temperature, fixing the flow rate to approximately 20 L/min for nitrogen, 10 L/min for ammonia, and 10 cc/min for TMG, and changing the flow rate of TMI, the multi-quantum well active layer 107 is stacked. More specifically, for the supply of TMI, repeating 15 times the combination of the flow rates of 50 cc/min for approximately one minute and 460 cc/min for approximately 30 seconds, and finally supplying it in the rate of 50 cc/min for three minutes, the active layer 107 having a multi-quantum well (MQW) structure including 15 cycles of 4 nm-thick barrier layers with the In composition ratio of 5% and 2 nm-thick well layers with the In composition ratio of 20% is obtained.

After that, the sapphire substrate 101 is heated to 1100° C. in three minutes while supplying nitrogen in the flow rate of approximately 20 L/min and ammonia in 10 L/min. Maintaining the temperature and supplying hydrogen in the flow rate of 15 L/min, nitrogen in 5 L/min, ammonia in 10 L/min, TMG in 100 cc/min and $Cp_2Mg$ in 50 cc/min for approximately three minutes, the 0.1 μm-thick p-type GaN guide layer 108 is formed. Next, additionally supplying TMA in the flow rate of 50 cc/min for approximately 10 minutes, the p-type AlGaN cladding layer 109 having the thickness of 0.2 μm is formed. Subsequently, stopping the supply of TMA, and continuously supplying the other source material gases for 15 minutes, the p-type GaN layer 110 having a thickness around 0.5 μm is formed.

After that, stopping the supply of TMG and $Cp_2Mg$, the temperature is decreased to 350° C., and interrupting the supply of hydrogen and ammonia at 350° C., the product is cooled to the room temperature. Then, the growth wafer is taken from the reactor.

After that, the growth wafer is set in a chamber of a vapor deposition apparatus, and titanium (Ti) is deposited to approximately 100 nm under a vacuum degree of approximately $1 \times 10^4$ Pa. Next executed is photo-etching to selectively remove Ti in an approximately 50 μm-long and 20 μm-wide rectangular region along the <1-100> axis direction of GaN. The wafer is then moved into an oxidization furnace, and annealed for 30 minutes at 700° C. under the supply of nitrogen in the flow rate of approximately 5 L/min. Since Ti is very easily oxidized, the thickness of the $TiO_2$ layer 111 amounts to approximately 300 nm. Presumably, the hydrogen derives from residual oxygen in the oxidization furnace or from hydrogen incorporated into the crystal. The $TiO_2$ film 111 is preferably as thick as 100 nm or more to realize a current blocking structure. However, if the $TiO_2$ film is excessively thick, a large step is produced and fails to solve the essential problem. Therefore, the thickness is preferably not larger than 1 μm. Since titanium can be readily etched by an appropriate etchant, it does not need dry etching in its patterning process. As a result, the invention can solve the conventional problem, namely, damage to the crystal of the nitride semiconductor caused by exposure to a dry etching atmosphere.

Also usable as the metal for the oxide film are magnesium (Mg), nickel (Ni), chromium (Cr), scandium (Sc), zinc (Zn), indium (In), tin (Sn) and tungsten (W). Since different metal oxides have different electric conductivities, the thickness should be determined appropriately. A preferable thickness is in the range of 300 nm to 2 μm in case of oxides of In or Sn, and in the range of 50 nm to 1 μm in case of oxides of other metals.

After that, the wafer having formed the current blocking layer 111 is again set onto the susceptor in the MOCVD apparatus, and heated to 550° C. in approximately three minutes while supplying nitrogen in the flow rate of approximately 20 L/min and ammonia in 10 L/min. Maintaining the temperature, and supplying hydrogen in the flow rate of 15 L/min, nitrogen in 5 L/min, ammonia in 10 L/min, TMG in 25 cc/min and $Cp_2Mg$ in 50 cc/min for about four minutes, the p-type GaN layer 112 with a thickness around 50 nm is formed. The GaN layer, just stacked, is amorphous or a poly-crystal oriented along the c-axis.

The temperature is next increased to 1100° C. while supplying hydrogen in the flow rate of 15 L/min, nitrogen in 5 L/min and ammonia in 10 L/min. The GaN layer 112 formed on the $TiO_2$ layer 111 is re-crystallized during the heating process. Maintaining the temperature and supplying hydrogen in the flow rate of 15 L/min, nitrogen in 5 L/min, ammonia in 10 L/min, TMG in 100 cc/min and $Cp_2Mg$ in 50 cc/min for approximately 60 minutes, an approximately 2 μm-thick mono-crystalline p-type GaN layer 113 is formed. Next supplying nitrogen in the flow rate of 20 L/min, ammonia in 10 L/min, TMG in 100 cc/min and $Cp_2Mg$ in 150 cc/min for six minutes, the p-type GaN contact layer 114 having the thickness of approximately 0.2 μm and a high carrier concentration is formed. After that, supplying only nitrogen in the flow rate of 10 L/min, the growth wafer is cooled to room temperature and removed from the reactor.

Subsequently, a 0.5 μm-thick $SiO_2$ film (not shown) is formed on the p-type GaN layer 114 by thermal CVD, for example, and selectively removed by photo etching, for example. Using the $SiO_2$ film and a photo-etching resist mask (not shown) as a mask, the product is etched until exposing the n-type GaN layer 104 by reactive ion etching using chlorine or other gases.

Next formed is a stacked structure of 50 nm-thick Ti and 0.5 μm-thick Au on a location of the n-type GaN layer 104 by known vapor deposition or sputtering, and the structure is annealed in a nitrogen atmosphere at 450° C. for about 30 seconds to form the n-type electrode 130. Although the embodiment makes the stacked structure of Ti and Au as the n-type electrode, an Al film may be inserted between the Ti film and the n-type layer. In this case, since Al plays the role of an ohmic contact, the Ti film changes its role to an improvement of the adhesive force between Al and Au. In this case, therefore, Ni, Cr, Pt or Pd may be used in lieu of Ti.

When Ni was used instead of Ti, another effect, namely, a decrease in resistance value, was confirmed in addition to an improvement in the adhesive force.

It is also possible to interpose a Si film with a thickness not more than 50 nm between Al and the n-type layer or to use an Al—Si alloy whose alloy composition is not larger than 10%. In any of these cases having a larger Si thickness or a higher alloy composition than these values, good ohmic characteristics could not be obtained.

Moreover, by using an electrode having a unique three-layered structure according to the invention, a further decrease in contact resistance and easy wire bonding are realized. This will be explained later in greater detail with reference to another embodiment of the invention.

Next stacked on the substantially entire surface of the p-type GaN layer 114 are approximately 10 nm-thick Pt, 50 nm-thick Ti, 30 nm-thick Pt and 1 μm-thick Au in this sequence by vapor deposition or sputtering, and they are annealed in a nitrogen atmosphere at 300° C. for 30 seconds, approximately, to form the p-type electrode 131. Although the embodiment uses a multi-layered structure of Pt, Ti, Pt and Au as the electrode, these metals and other metals, such as Al, Ag, Ni, Cr, Mg, Si, Zn, Be, Ge, In, Pd and Sn, can be used to make the electrode in form of a single layer, a multi-layered layer or an alloy.

To improve the adhesive strength of the bonding on the electrodes 130 and 131, approximately 5 nm-thick Cr and 1 μm-thick Au are stacked in this order to form an electrode pad. By applying a bonding of Au, for example, the device is made operative.

After the electrodes are formed on the device, the bottom surface of the sapphire substrate 101 (the surface opposite from the surface having formed the device) is polished into the thickness of 60 μm, and the device is divided into a plurality of devices approximately sized 500 μm×1 mm by line-scribing it from the bottom surface of the substrate.

After that, a multi-layered film 140 made of $SiO_2$ and $TiO_2$ is formed on the surface used as the laser facet to improve the reflectance of the laser facet.

As explained above, the invention uses the $TiO_2$ film as the current blocking layer 111 and need not use dry etching upon making it. As a result, the invention overcomes the conventional problem that the crystal of the nitride semiconductor is damaged and causes an increase in leakage current, and can effectively confine the injected current within the active layer 107.

A semiconductor laser 100, actually prepared in this manner, certainly operated under the current density of 3 $kA/cm^2$. The pulsation wavelength depends on the average In composition of the active layer 107, and pulsation of a wavelength in the range of 390 nm to 450 nm is possible.

(Second Embodiment)

Figure 2:
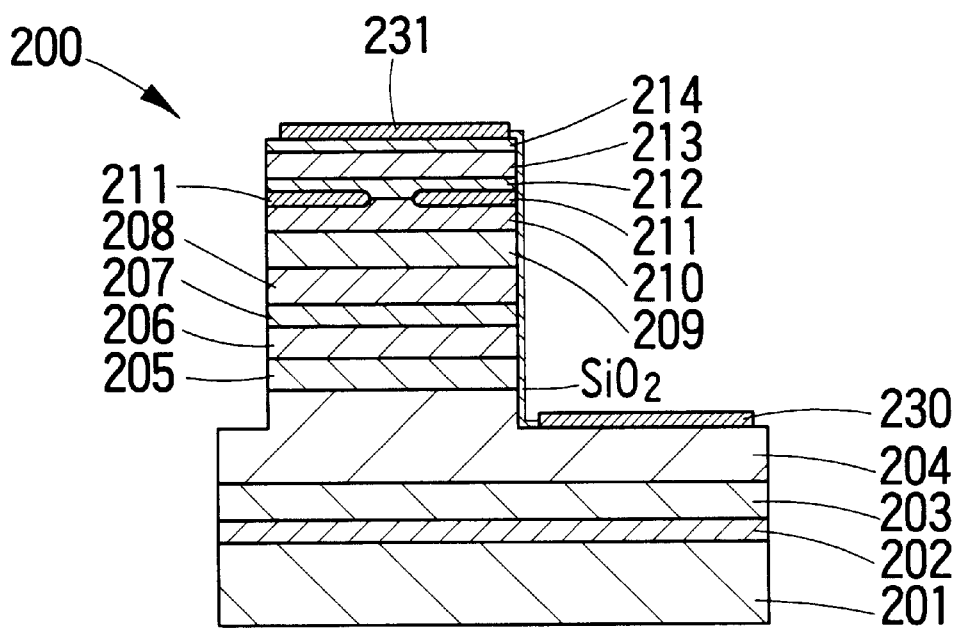
FIG. 2 is a diagram showing a cross-sectional structure of a nitride compound semiconductor light emitting device according to the second embodiment of the invention.

FIG. 2 shows a cross-sectional structure of a semiconductor laser 200 taken as the second embodiment of the invention. The semiconductor laser 200 has a sapphire substrate 201 having an a-plane as its major surface, and a laser structure of nitride compound semiconductors is formed on the substrate 201. More specifically, stacked on the substrate 201 are, sequentially, an AlN buffer layer 202, undoped GaN layer 203, n-type GaN contact layer 204, n-type AlGaN cladding layer 205, n-type GaN guide layer 206, multi-quantum well active layer 207, p-type GaN guide layer 208, p-type AlGaN cladding layer 209, p-type GaN layer 210, current blocking layer 211, p-type GaN layer 212, p-type GaN layer 213, and p-type GaN contact layer 214. An n-side electrode 230 is formed on the n-type contact layer 204, and a p-side electrode 231 is formed on the p-type contact layer 214.

The current blocking layer 211 is one of subjects mainly dealt with in the present invention. In this embodiment, the current blocking layer 211 is a carbon film. By using the carbon film as the current blocking layer, dry etching need not be used for its patterning. This results in causing no damage to the crystal of the nitride semiconductor, preventing current leakage, ensuring current injection into the active layer 207 with a higher efficiency than conventional devices, and promising laser pulsation under a low threshold current density.

First introduced is the sapphire substrate 201, after being cleaned by an organic solvent or acid, into a reactor of a MOCVD system, and set on a susceptor to be heated by radio-frequency waves. While supplying hydrogen in the flow rate of 10 L/min under the atmospheric pressure, the substrate 201 undergoes vapor-phase etching at the temperature of 1100° C. for approximately 10 minutes to remove a native oxide from its surface.

Then, the temperature of the sapphire substrate 201 is decreased to 550° C., and the GaN buffer layer 202 of a thickness around 30 nm is stacked by supplying hydrogen in the flow rate of 15 L/min, nitrogen in 5 L/min, ammonia in 10 L/min and TMA in 50 cc/min for approximately four minutes. The sapphire substrate 201 is next heated to 1100° C. while supplying hydrogen in the flow rate of 15 L/min, nitrogen in 5 L/min and ammonia in 10 L/min, and the undoped GaN layer 203 of a thickness around 2 μm is stacked while supplying hydrogen in the flow rate of 15 L/min, nitrogen in 5 L/min, ammonia in 10 L/min and TMG in 100 cc/min for 60 minutes.

Then, additionally supplying hydrogen-diluted 10 ppm $SiH_4$ in the flow rate of 3 cc/min four approximately 130 minutes, the n-type GaN layer 204 of a thickness around 4 μm is stacked. Then, also supplying TMA in the flow rate of 50 cc/min in addition to these source materials for approximately 10 minutes, the n-type AlGaN cladding layer 205 is stacked by a thickness of approximately 0.2 μm.

Then, the temperature of the sapphire substrate 201 is decreased to 800° C. while supplying nitrogen in the flow rate of approximately 20 L/min and ammonia in 10 L/min. Maintaining the temperature and supplying nitrogen in the flow rate of 20 L/min, ammonia in 10 L/min, TMG in 13 cc/min and TMI in 30 cc/min for approximately three minutes, the GaN guide layer 206 with a thickness around 15 μm is stacked.

Subsequently, maintaining the temperature at 800° C., fixing the flow rates at 20 L/min for nitrogen, 10 L/min for ammonia and 13 cc/min for TMG, and supplying TMI while repeating five times the combination of the flow rates of 20 cc/min for approximately one minute and 470 cc/min for approximately 30 seconds, and finally setting the flow rate to 52 cc/min for approximately three minutes, the active layer 207 having a multi-quantum well (MQW) structure including 5 cycles of 5 nm-thick barrier layers with the In composition ratio of 5% and 3 nm-thick well layers with the In composition ratio of 20% is obtained.

By further supplying nitrogen in the flow rate of 20 L/min, ammonia in 10 L/min, TMG in 13 cc/min and TMI in 300 cc/min for approximately three minutes, the InGaN guide layer 208 with the thickness of 0.5 µm is formed.

After that, the sapphire substrate 201 is heated to 1100° C. in three minutes while supplying nitrogen in the flow rate of approximately 20 L/min and ammonia in 10 L/min. Maintaining the temperature and supplying hydrogen in the flow rate of 15 L/min, nitrogen in 5 L/min, ammonia in 10 L/min, TMG in 100 cc/min, TMA in 50 cc/min and Cp$_2$Mg in 50 cc/min for approximately ten minutes, the p-type AlGaN cladding layer 209 having the thickness of 0.2 µm is formed. Subsequently, stopping the supply of TMA and continuing the supply of the other source material gases for approximately 15 minutes, the p-type GaN layer 210 of a thickness around 0.5 µm is formed.

After that, stopping the supply of TMG and Cp$_2$Mg, decreasing the temperature to 400° C., thereafter stopping the supply of hydrogen and ammonia at 400° C. and cooling the product to room temperature, the growth wafer is removed from the reactor.

Next stacked on the growth wafer is a SiO$_2$ film (not shown) by known thermal CVD, and it is processed by patterning to the SiO$_2$ film only in a rectangular region with the length of 500 µm along the M-axis (<10-10> axis) of the sapphire substrate and the width of approximately 30 µm. Since the M-plane of sapphire and the M-plane of a GaN material coincide on a substrate with an a-plane orientation, it is recommended to use this surface as the cavity facet.

After that, the wafer is set within a resistance heater, and annealed in a nitrogen atmosphere at 900° C. for approximately one hour. As a result, a carbon layer with a thickness around 100 nm is formed in the region without the SiO$_2$ film. The carbon has been contained in the crystal, and its main source is considered to be carbon contained in organic metal source materials. The carbon layer 211, thus obtained, behaves as the current blocking layer. Since carbon has a high electric resistance, it is sufficient for the carbon layer 211 to be 30 nm thick or more. If a larger thickness of the carbon layer 211 is desired, annealing over a long time is required. However, long-time annealing may cause carbon to diffuse into the active layer 207 and may produce a non-radiative center, the maximum thickness of the carbon layer 211 is preferably in the range from 200 nm to 500 nm, approximately, although depending on the film making conditions.

After that, the wafer having formed the carbon layer 211 is returned onto the susceptor in the MOCVD apparatus, and heated to 400° C. in three minutes while supplying nitrogen in the flows rate of about 20 L/min and ammonia of 10 L/min. Maintaining the temperature and supplying hydrogen in 5 L/min, nitrogen in 15 L/min, ammonia in 10 L/min, TMG in 25 cc/min, and Cp$_2$Mg in 50 cc/min for approximately four minutes, the p-type GaN layer 212 with a thickness around 20 nm is formed. Under these growth conditions, the p-type GaN layer 212 exhibits an amorphous state or a polycrystalline layer having a c-axis orientation.

The wafer is next heated to 1100° C. while supplying hydrogen in the flow rate of 15 L/min, nitrogen in 5 L/min and ammonia in 10 L/min. In the heating process, the GaN layer 212 is re-crystallized. Maintaining the temperature and supplying hydrogen in the flow rate of 15 L/min, nitrogen in 5 L/min, ammonia in 10 L/min, TMG in 100 cc/min and Cp$_2$Mg in 500 cc/min for approximately 60 minutes, an approximately 2 µm-thick single-crystal p-type GaN layer 213 is formed.

Next supplying nitrogen in the flow rate of 20 L/min, ammonia in 10 L/min, TMG in 100 cc/min, and Cp$_2$Mg in 150 cc/min for approximately six minutes, an approximately 0.2 µm-thick high-concentration p-type GaN layer 214 is obtained.

After that, a 0.5 µm-thick SiO$_2$ film (not shown) is formed on the p-type GaN layer 214 by thermal CVD, for example, and selectively removed by photo etching, for example. Using the SiO$_2$ film and a photo-etching resist mask (not shown) as a mask, the product is etched until exposing the n-type GaN layer 204 by reactive ion etching using boron trichloride, for example. It is preferable to passivate the side surfaces of the mesa by coatings such as SiO$_2$ film to prevent the damage to the crystal after exposing the n-type layer 204.

The electrodes 230 and 231 are made in the same process as used in the first embodiment.

The wafer obtained by the process is cleaved along the direction normal to the M-axis to use the cleaved surface as the cavity facet, and further divided into a plurality of devices in the directions normal to it by cleavage, dicing or other appropriate process.

Also this embodiment need not use dry etching by making the current blocking layer 211 of carbon, and therefore prevents damage to the crystal of nitride semiconductors. It results in preventing leakage of current and ensuring efficient current injection into the current layer.

With a semiconductor laser 200, actually prepared in this manner, pulsation of the wavelength of 410 nm was certainly confirmed under the threshold current density of 3 kA/cm$^2$ at the room temperature.

Although the embodiment has been explained as making the cavity facet normal to the M-axis, a semiconductor laser can be made by forming a stripe along the R-axis within the plane.

Although the cavity in the present invention is made to extend along the M-axis, the cavity facet can be made along the plane normal to the R-axis by preparing a substrate crystal in which its C-axis (<0001> axis) and R-axis (<10-12> axis) appear in vertical positions within the plane. Since an R-oriented surface facilitates cleavage of sapphire as a substrate, a cavity facet with a high reflectance can be obtained. Actually, laser pulsation under the threshold current density of 1 kA/cm$^2$ was realized.

(Third Embodiment)

Figure 3:
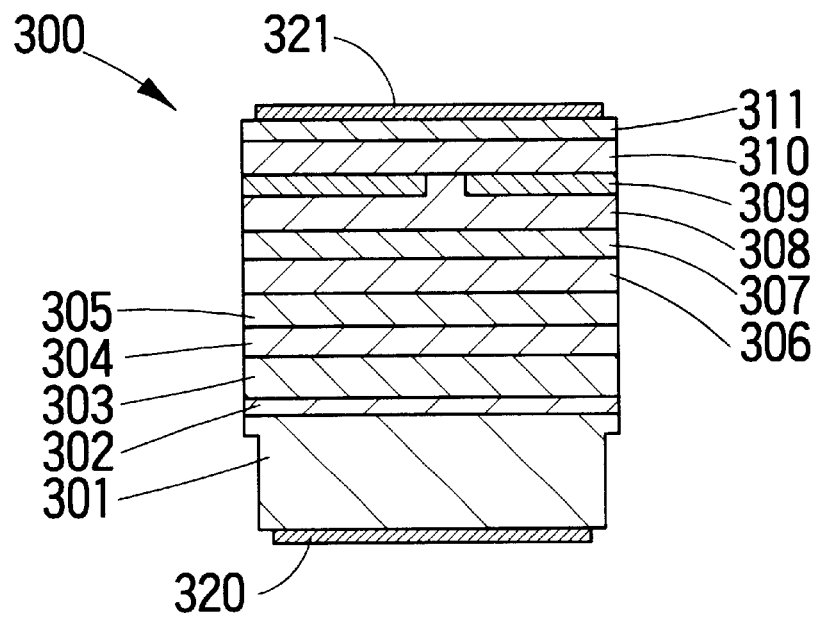
FIG. 3 is a diagram showing a cross-sectional structure of a nitride compound semiconductor light emitting device according to the third embodiment of the invention.

FIG. 3 shows a cross-sectional structure of a semiconductor laser 300 taken as the third embodiment of the invention. The semiconductor laser 300 has a 4 H-type SiC substrate 301 whose major surface is the carbon plane among (0001) planes, and a laser structure of nitride compound semiconductors is formed on the substrate 301. Numeral 309 denotes a current blocking layer which is mainly dealt with in the present invention.

In the semiconductor laser 300, stacked on the substrate 301 are, sequentially, a GaN buffer layer 302, n-type GaN layer 303, n-type AlGaN cladding layer 304, n-type GaN guide layer 305, multi-quantum well active layer 306, p-type GaN guide layer 307, p-type AlGaN cladding layer 308, i-type AlGaN current blocking layer 309, p-type GaN layer 310, and p-type InGaN contact layer 311. An n-side electrode 320 is formed on the bottom surface of the SiC substrate 301, and a p-side electrode 321 is formed on the p-type contact layer 311.

Explained below is a method for manufacturing the semiconductor laser 300.

First introduced is the n-type SiC substrate 301, after being cleaned by an organic solvent or acid, into a reactor of a MOCVD system, and set on a susceptor to be heated by a radio-frequency wave. While supplying hydrogen in the flow rate of 10 L/min under the atmospheric pressure, the substrate 301 undergoes vapor-phase etching at the temperature of 1100° C. for approximately 10 minutes to remove a native oxide from its surface.

Then, the temperature of the SiC substrate 301 is decreased to 550° C., and the GaN buffer layer 302 with a thickness around 20 nm is stacked by supplying hydrogen in the flow rate of 15 L/min, nitrogen in 5 L/min, ammonia of 10 L/min and TMG in 25 cc/min.

Next supplying hydrogen in the flow rate of 15 L/min, nitrogen 5 L/min and ammonia in 10 L/min, the SiC substrate 301 is heated to 1100° C., and while supplying hydrogen in the flow rate of 15 L/min, nitrogen in 5 L/min, ammonia in 10 L/min, and hydrogen-diluted 10 ppm $SiH_4$ in 3 cc/min for approximately 60 minutes, the n-type GaN layer 303 with a thickness about 2 $\mu$m is formed. Also supplying TMA in 50 cc/min in addition to these source materials for approximately ten minutes, the n-type AlGaN cladding layer 304 with the thickness of 0.2 $\mu$m is formed.

After that, the temperature of the SiC substrate 301 is decreased to 820° C. while supplying nitrogen in approximately 20 L/min and ammonia in 10 L/min. Maintaining the temperature and supplying hydrogen in the flow rate of 5 L/min, nitrogen in 15 L/min, ammonia in 10 L/min, TMG in 10 cc/min and $SiH_4$ in 1 cc/min for approximately three minutes, the n-type GaN guide layer 305 with the thickness of 0.15 $\mu$m is stacked.

Maintaining the temperature at 820° C. and fixing the flow rates to approximately 20 L/min for nitrogen, 10 L/min for ammonia and 10 cc/min for TMG, the cycle of supplying TMI in the flow rate of 450 cc/min for one minute is repeated three times with one-minute interruptions. In this manner, the MQW active layer 306 including well layers and GaN barrier layers having the In composition ratio of 20% is obtained. The growth is made here so that a GaN layer appears on the top surface.

The wafer is next heated to 1100° C. in approximately three minutes while supplying nitrogen in the flow rate about 20 L/min and ammonia in 10 L/min. Maintaining the temperature and supplying hydrogen in the flow rate of 15 L/min, nitrogen in 5 L/min, ammonia in 10 L/min, TMG in 100 cc/min, and $Cp_2Mg$ in 50 cc/min for approximately three minutes, the p-type GaN guide layer 307 having the thickness of 0.15 $\mu$m is stacked. Then, additionally supplying TMA in 50 cc/min together with the other gases for approximately 10 minutes, the p-type AlGaN cladding layer 308 with the thickness of 0.2 $\mu$m is stacked. After that, when the growth wafer naturally cools down to room temperature, it is removed from the MOCVD growth reactor.

Next formed on the surface of the growth wafer is a resist mask (not shown) having the length of 50 $\mu$m along the <1-100> direction of the GaN material and the width of 20 $\mu$m. Then, an $SiO_2$ film (not shown) is stacked on the wafer surface by plasma CVD, and the $SiO_2$ film is selectively removed. As a result, an $SiO_2$ film having a 500 $\mu$m-long and 20 $\mu$m-wide hole extending in the <1-100> direction of the GaN material is formed on the cladding layer 308. After that, the wafer is annealed at 700° C. for approximately 30 minutes.

As a result, the i-type AlGaN region 309, in which carriers are inactivated by hydrogen and/or oxygen, is formed in the AlGaN layer 308 immediately under the $SiO_2$ film. However, depending upon selected conditions of plasma CVD and subsequent annealing, Si in the $SiO_2$ film may diffuse into the cladding layer 308 and may form an n-type current blocking region.

The layer 309 made by partly inactivating carriers behaves as a current blocking layer. The Inventors has found that inactivation of carriers occurs when using plasma CVD as the stacking process of the $SiO_2$ film, and does not occur when using thermal CVD. According to the invention, since a part of the cladding layer 308, to which a current is injected, is protected by a stripe-shaped resist mask (not shown), it is never exposed to harmful plasma even when plasma CVD is used. After the layer 309 is formed, the $SiO_2$ film (not shown) is removed, and the wafer is again set on the susceptor in the MOCVD apparatus.

Next supplying hydrogen in the flow rate of 15 L/min, nitrogen in approximately 5 L/min, and ammonia in 10 L/min, the wafer is heated to 1100° C. in six minutes. Maintaining the temperature and supplying hydrogen in the flow rate of 15 L/min, nitrogen in approximately 5 L/min, ammonia of 10 L/min, TMG in 100 cc/min and $Cp_2Mg$ in 50 cc/min about 30 minutes, the p-type GaN layer 310 with the thickness about 1 $\mu$m is stacked.

The temperature is next decreased to 820° C. while supplying nitrogen in approximately 20 L/min and ammonia in 10 L/min. Maintaining the temperature and supplying nitrogen in the flow rate of 20 L/min, ammonia in 10 L/min, TMG in 10 cc/min, TMI in 30 cc/min and $Cp_2Mg$ in 50 cc/min for approximately three minutes, the p-type InGaN contact layer 311 with the thickness of 0.1 $\mu$m is stacked. After that, interrupting the supply of TMG, TMI, $Cp_2Mg$ and ammonia and supplying only nitrogen in 20 L/min, the wafer is cooled to room temperature, and removed from the reactor.

In this embodiment, electrically conductive SiC is used as the substrate. Therefore, this embodiment is more advantageous than the first and second embodiments in that it does not require etching for electrical contact with the n-type layer. As one electrode, the n-type electrode 320 is formed on the bottom surface of the n-type SiC substrate 301 by stacking approximately 50 nm-thick Pt, approximately 50 nm-tick Ti and approximately 2 $\mu$m-thick Au in this sequence and by annealing it in a nitrogen atmosphere at 1000° C. for five minutes. For the p-type InGaN contact layer 311, a similar stacked structure is made and then annealed in a nitrogen atmosphere at 350° C. for approximately 30 seconds to form the p-type electrode 321.

The semiconductor laser wafer, thus obtained, is cleaved by the pitch of 500 $\mu$m. Since readily cleaved SiC used as the substrate needs no process for polishing the substrate, this embodiment is more advantageous also in this respect than devices using sapphire substrates. With a laser device 300 actually prepared in this process, continuous pulsation of the wavelength of 420 nm and power of 5 mW was certainly confirmed.

Although the embodiment has been explained as using a 4H-type SiC substrate whose major surface is (0001)C (carbon) plane of SiC, the Si plane may be used. It is also possible to use a 6 H type or a 2 H type SiC substrate instead of the 4H type SiC. When an SiC substrate is used, a substrate offset from the (0001) plane toward the <11-20> direction by 3 to 10 degrees promises better crystals.

(Fourth Embodiment)

Figure 4:
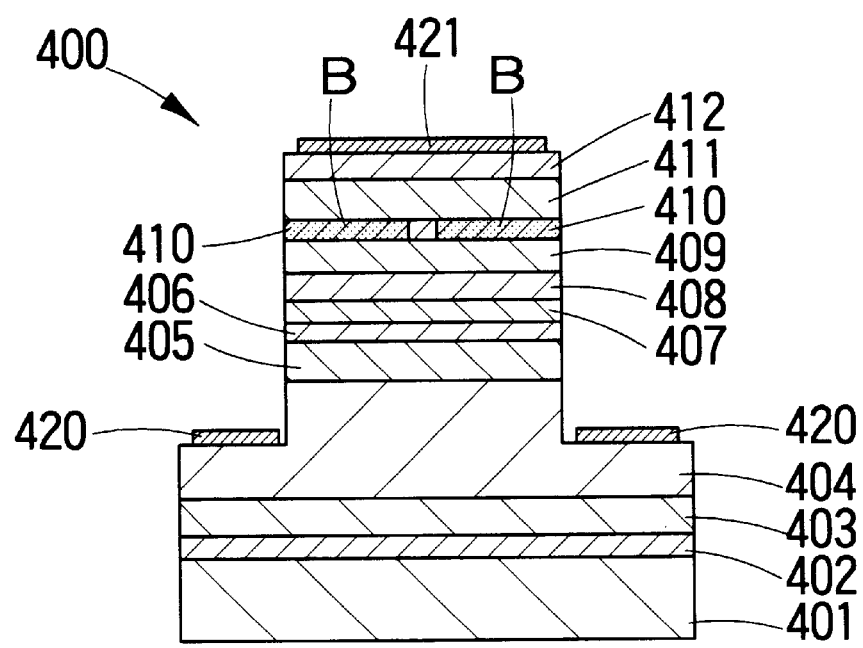
FIG. 4 is a diagram showing a cross-sectional structure of a nitride compound semiconductor light emitting device according to the fourth embodiment of the invention.

FIG. 4 shows a cross-sectional structure of a semiconductor laser 400 taken as the fourth embodiment of the invention. The semiconductor laser 400 includes a laser structure formed on a sapphire substrate 401. The semiconductor laser 400 shown here has formed an InGaN layer 410 including an n-type current blocking region used as the current blocking layer.

That is, in the semiconductor laser 400, stacked on the substrate 401 are a InN buffer layer 402, n-type GaN layer 403, n-type GaN contact layer 404, n-type AlGaN cladding layer 405, n-type GaN guide layer 406, multi-quantum well active layer 407, p-type GaN guide layer 408, p-type AlGaN layer 411, and p-type InGaN contact layer 412. An n-side electrode 420 is formed on the n-type contact layer 404, and a p-side electrode 421 is formed on the p-type contact layer 412.

For fabrication of the semiconductor laser 400 according to the embodiment, MOCVD may be used like the former embodiments. Source material gases and the sequence of growth may be the same as those of the former embodiments, and their detailed explanation is omitted here.

That is, in this embodiment, introducing the substrate 401 into an MOCVD apparatus, layers from the buffer layer 402 to the p-type cladding layer 409 are grown in the above-explained process, and the p-type InGaN layer 410 is grown. After that, selectively introducing an n-type impurity into the p-type GaN layer 410, the current blocking region B is formed. Here are shown two different examples of the process for making the current blocking region B.

In the first example of the process, a resist mask (not shown) in form of a 500 μm-long, 20 μm-wide stripe extending along the <1-100> direction of the GaN material is first made on the surface of the p-type InGaN layer 410. Next stacked on the wafer surface is a SiO$_2$ film (not shown) by plasma CVD, and the SiO$_2$ film is selectively removed by lift-off. As a result, a SiO$_2$ film having a 500 μm-long, 20 μm-wide hole extending along the <1-100> direction of the GaN material. The wafer is thereafter annealed at 700° for approximately 30 minutes.

As a result, Si diffuses from the SiO$_2$ film into the InGaN layer 410 immediately under the SiO$_2$ layer to change the InGaN layer 410 to n-type. However, depending on selected conditions of plasma CVD and/or annealing, there may be produced an i-type InGaN region in which carriers are inactivated by hydrogen and/or oxygen. The n-type InGaN region or i-type InGaN region, thus obtained, behaves as the current blocking layer B.

Another example of the process for making the current blocking region B in the p-type InGaN layer 410 is as follows. That is, formed on the p-type InGaN layer 410 is a thin film of an n-type impurity, such as silicon (Si). The thin film may be formed by supplying silane gas into the MOCVD. After that, the n-type impurity thin film is selectively removed. The pattern of the removed portion is substantially the same as the pattern of current injection into the active layer 407. For example, a stripe-shaped area may be removed. For removal, if it is a silicon film, wet etching using a known etchant containing hydrofluoric acid, for example, may be employed. Therefore, the conventional problem that dry etching damages the crystal of the nitride semiconductor can be overcome. Next, it is annealed. Annealing conditions may be, for example, 900° C. and approximately two hours. By the annealing process, silicon or other n-type imparity diffuses into the p-type InGaN layer 410 to form the n-type InGaN current blocking region B.

In any of these examples of the process, introduction of an n-type impurity not less than $1\times10^{18}$ cm$^{-3}$, preferably of $1\times10^{19}$ cm$^{-3}$, is necessary to change the InGaN layer 410 from its original p-type into n-type.

After the current blocking layer B is made, the other layers are grown again in the reactor of the MOCVD apparatus, and through the steps of etching and forming electrodes as explained with the first embodiment, the semiconductor laser 400 is completed.

In order to ensure a sufficient current blocking effect in the laser according to the embodiment, the InGaN layer 410 is preferably as thick as 0.1~0.2 μm, and preferably has a composition ratio in the range of x=0.01~0.3 when it is In$_x$Ga$_{1-x}$N because values of x below the range cause insufficient confinement of light and an increase in threshold value, and values of x above the range make it very difficult to obtain a layer with a good quality and a sufficient thickness.

On the other hand, the current blocking region B in the laser according to the embodiment contain p-type impurities such as magnesium in addition to n-type impurities. As a result, the current blocking region B also behaves as an absorption layer for emission wavelengths from the active layer 407, and self-pulsation can be induced by selecting an appropriate device structure.

(Fifth Embodiment)

Figure 5:
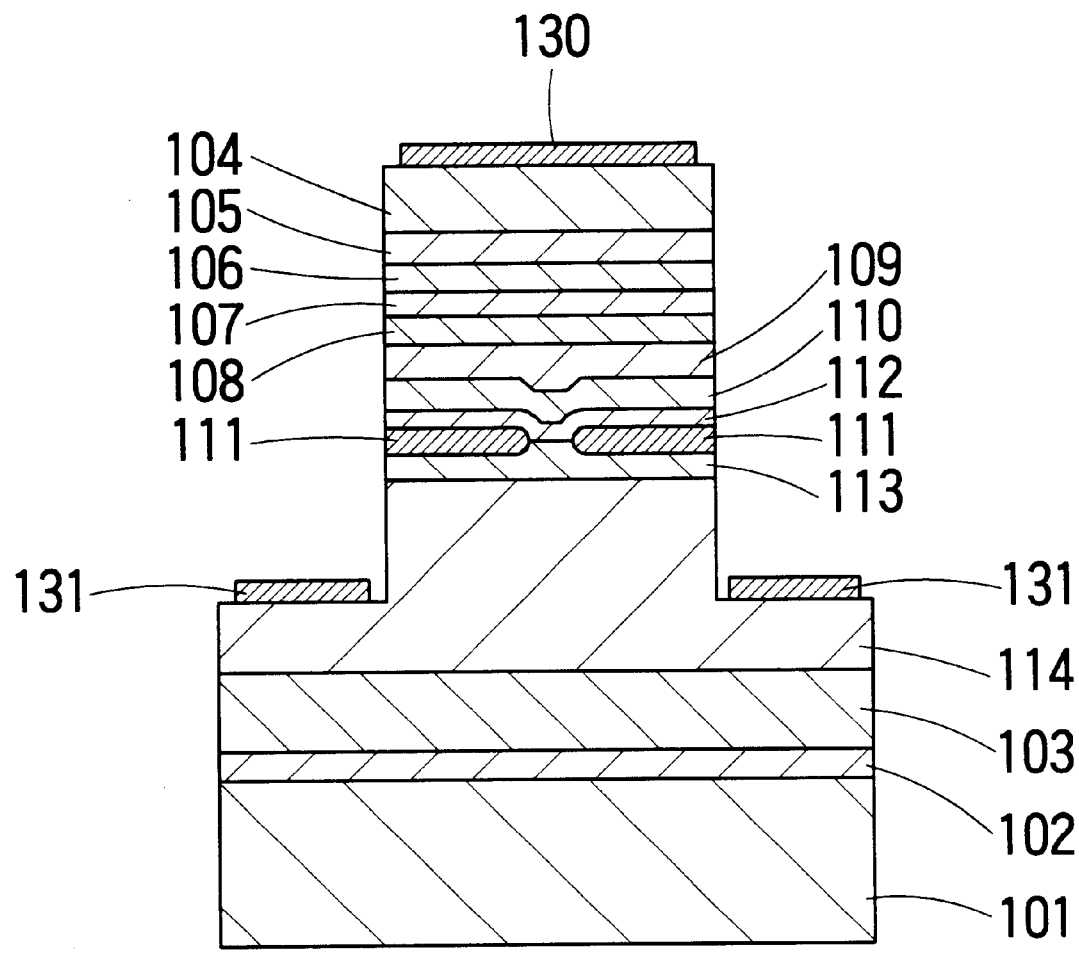
FIG. 5 is a diagram showing a cross-sectional structure of a nitride compound semiconductor light emitting device according to the fifth embodiment of the invention.

FIG. 5 shows a cross-sectional structure of a semiconductor laser 500 taken as the fifth embodiment of the invention. The semiconductor laser 500 has a structure where p-type layers and n-type layers in the semiconductor laser 100 explained before with reference to FIG. 1 are stacked in the inverted order. That is, in the semiconductor laser 500, stacked on a sapphire substrate 101 having a c-plane as its major surface are a GaN buffer layer 102, undoped GaN layer 103, p-type GaN contact layer 114, p-type GaN layer 113, current blocking layer 111, p-type GaN layer 112, p-type GaN layer 110, p-type AlGaN cladding layer 109, p-type GaN guide layer 108, multi-quantum well active layer 107, n-type GaN guide layer 106, n-type guide AlGaN cladding layer 105, and n-type GaN contact layer 104 in this sequence. The n-side electrode 130 is formed on the n-type contact layer 104, and the p-side electrode is formed on the p-type contact layer 114.

Any of the materials explained with the foregoing embodiments may be used as the material of the current blocking layer 111. That is, the embodiment can injected a current with a higher efficiency than conventional devices, and laser pulsation occurs under a lower threshold current density.

Moreover, since the current blocking layer underlies the active layer 107, after-processing of the active layer may be only once, and the embodiment is advantageous from others from the viewpoint of the process.

(Sixth Embodiment)

Figure 6:
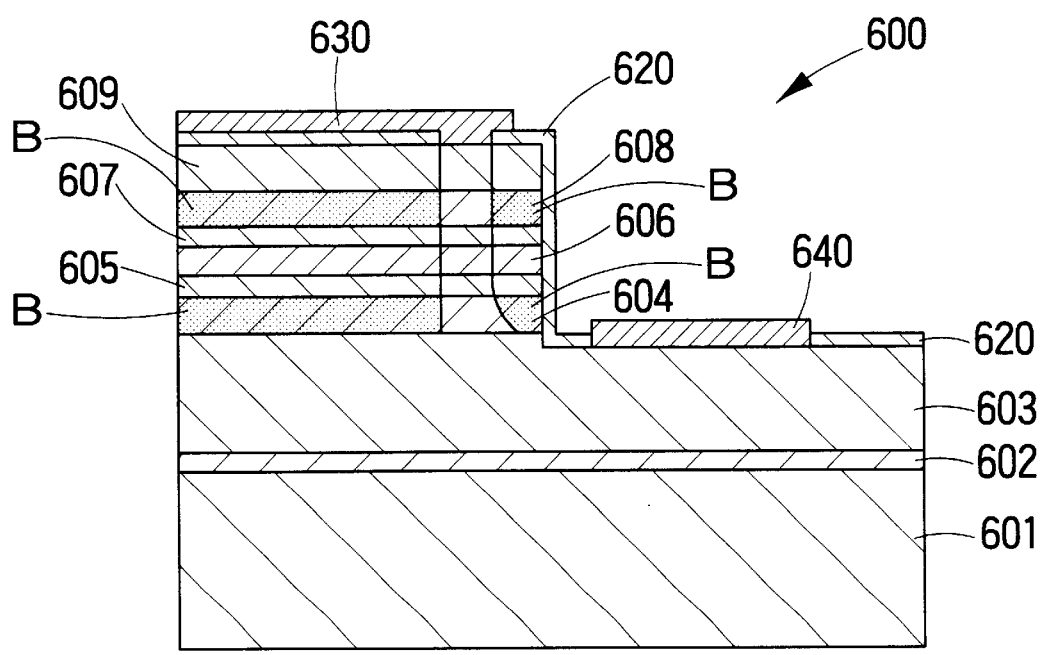
FIG. 6 is a diagram showing a cross-sectional structure of a nitride compound semiconductor light emitting device according to the sixth embodiment of the invention.

FIG. 6 is a cross-sectional view showing the structure of a semiconductor laser 600 taken as the sixth embodiment of the invention. The semiconductor laser 600 includes a sapphire substrate 601 having a c-plane as its major surface. Stacked on the sapphire substrate 601 is a 50 nm-thick GaN buffer layer 602. Stacked on the buffer layer 602 is a 4 μm-thick n-type contact layer 603 made of Si-doped GaN to the carrier concentration of $2\times10^{18}$ cm$^{-3}$. On a part of the n-type contact layer 603 excluding a portion for making an n-type electrode 640, sequentially stacked are a 0.5 μm-thick n-type cladding layer 604 made of Si-doped AlGaN by the carrier concentration of $1\times10^{18}$ cm$^{-3}$ (Al composition ratio of 8%), 0.3 μm-thick n-type guide layer 605 made of Si-doped GaN by the carrier concentration of $1\times10^{17}$ cm$^{-3}$, multi-quantum well (MQW) active layer 606 containing five pairs of InGaN barrier layers each being 2 nm-thick and having the In composition ratio of 4% and InGaN well layers each being 4 nm-thick and having the In composition ratio of 18%, 0.3 µm-thick p-type guide layer 607 made of Mg-doped GaN to the carrier concentration of $1 \times 10^{17}$ cm$^{-3}$, 0.5 µm-thick p-type cladding layer 608 made of Mg-doped AlGaN to the carrier concentration of $2 \times 10^{17}$ cm$^{-3}$ (Al composition ratio of 8%), and 0.3 µm-thick p-type contact layer 609 made of Mg-doped GaN to the carrier concentration of $3 \times 10^{17}$ cm$^{-3}$. Formed on the p-type contact layer 609 is an SiO$_2$ film 620 having a 5 µm-wide opening. Formed in the opening, in contact with the p-type contact layer 609, is a three-layered electrode 630 made of 50 nm-thick palladium (Pd), 10 nm-thick platinum (Pt) and 2 µm-thick gold (Au). An electrode 640 is formed on the n-type contact layer. The electrode 640 has a three-layered structure of 300 nm-thick aluminum (Al) in contact with the n-type contact layer 603, 50 nm-thick platinum (Pt) and 1.5 µm-thick gold (Au).

In the laser according to the invention, an internal current blocking structure is formed without executing etching. That is, by applying a reverse bias voltage to make the p-side electrode voltage be negative and the n-side electrode voltage be positive, both the p-type cladding layer and the n-type cladding layer can form the current blocking region B.

Next explained is a method for fabricating the semiconductor laser 600 having the above-mentioned construction. Metal-organic chemical vapor deposition is employed for fabrication shown here. Usable gases are ammonia (NH$_3$), trimethylgallium (Ga(CH$_3$)$_3$, hereinbelow abbreviated to TMG), trimethylaluminum (Al(CH$_3$)$_3$, hereinbelow abbreviated to TMA), trimethylindium (In(CH$_3$)$_3$, hereinbelow abbreviated to TMI), bis-cyclopentadienile-magnesium (Mg(C$_5$H$_5$)$_2$, hereinbelow abbreviated to Cp$_2$Mg) silane (SiH$_4$), and hydrogen (H$_2$) and nitrogen (N$_2$) as carrier gases.

First introduced is the single-crystal sapphire substrate 601 having a c-plane as its major surface, after being cleaned by an organic solvent or acid, into a reactor of an MOCVD system, and set on a susceptor to be heated by radio-frequency waves. While supplying hydrogen in the flow rate of 20 L/min under the atmospheric pressure, the substrate 301 undergoes vapor-phase etching at the temperature of 1200° C. for approximately 10 minutes to remove a native oxide from its surface.

Then, the temperature of the SiC substrate 601 is decreased to 530° C., and the GaN buffer layer 602 is stacked by supplying hydrogen in the flow rate of 15 L/min, nitrogen in 5 L/min, ammonia of 10 L/min and TMG in 25 cc/min for approximately four minutes. The sapphire substrate 601 is next heated to 1100° C. by supplying hydrogen in the flow rate of 15 L/min, nitrogen in 5 L/min, and ammonia in 10 L/min, and the n-type GaN contact layer 603 is formed by supplying hydrogen in the flow rate of 15 L/min, nitrogen in 5 L/min, ammonia in 10 L/min, TMG in 100 cc/min and SiH$_4$ diluted by hydrogen into 10 ppm in 3 cc/min for approximately 130 minutes. Additionally supplying TMA in 50 cc/min together with these source material gases for approximately 22 minutes, the n-type AlGaN cladding layer 604 is stacked. After that, interrupting the supply of TMA and supplying SiH$_4$ reduced to the reduced flow rate of 1 cc/min for approximately 10 minutes, the n-type GaN guide layer 605 is stacked.

Next supplying nitrogen in approximately 20 L/min and ammonia in 10 L/min, the temperature of the sapphire substrate 601 is decreased to 750° C. in approximately three minutes. Maintaining the temperature, fixing the flow rates to approximately 20 L/min for nitrogen, 10 L/min for ammonia and 10 cc/min for TMG, and supplying TMI while repeating five times the combination of the flow rates of 30 cc/min for approximately one minute and 180 cc/min for approximately 30 second, and finally setting the flow rate to 30 cc/min for approximately one minute, the active layer 606 having a multi-quantum well (MQW) structure including 5 cycles of barrier layers with the In composition ratio of 5% and well layers with the In composition ratio of 20% is obtained.

Next supplying nitrogen in the flow rate of 20 L/min and ammonia in 10 L/min, the sapphire substrate 601 is heated to 1100° C. Maintaining the temperature and supplying hydrogen in the flow rate of 15 L/min, nitrogen in 5 L/min, ammonia in 10 L/min, TMG in 100 cc/min and Cp$_2$Mg in 50 cc/min for approximately 10 minutes, the p-type GaN guide layer 607 is stacked. Additionally supplying TMA in 50 cc/min together with these source materials for approximately 22 minutes, the p-type AlGaN cladding layer 608 is stacked. Subsequently, supplying hydrogen in the flow rate of 0.5 L/min, nitrogen in 19.5 L/min, ammonia in 10 L/min, TMG in 100 cc/min and Cp$_2$Mg in 50 cc/min for approximately ten minutes, the p-type GaN contact layer 609 is stacked.

After that, interrupting the supply of TMG and Cp$_2$Mg, the temperature is decreased to 350° C., and stopping the supply of hydrogen and ammonia at 350° C., the growth wafer is cooled to the room temperature, and removed from the reactor.

Next formed on the p-type GaN contact layer 609 is a SiO$_2$ film (not shown) with a thickness of 0.5 µm by thermal CVD, for example, and it is masked by a resist, for example. Then, the SiO$_2$ film is patterned into a 150 µm-thick stripe by photo etching, for example, and the portion without the SiO$_2$ film is etched by using chlorine gas until expose the n-type GaN layer 603.

Next stacking the SiO$_2$ film 620, an approximately 10 µm-thick stripe-shaped opening is formed on the p-type GaN contact layer 609 by photo etching, for example. By stacking 50 nm-thick Pd, 100 nm-thick Pt, 1.5 µm-thick Au in the opening by vacuum evaporation, for example, the electrode 630 is formed. Subsequently, the n-side electrode 640 having a three-layered structure including a 300 nm-thick Al layer, 50 nm-thick Pt layer and 1.5 µm-thick Au layer is formed on the n-type GaN contact layer by vacuum evaporation, sputtering, or the like. The electrode is preferably annealed at a temperature around 400° C.

Electrodes actually made had a contact resistance of $10^{-4}$ Ωcm$^2$, and no deterioration by electric conduction was observed.

Using the wafer prepared in the above-explained process, a voltage of 20V was applied for approximately two hours under a reverse condition making the electrode 630 be negative and the electrode 640 be positive. As a result, Mg contained in the layers 607 to 609 having been described as being p-type layers was activated. Additionally, hydrogen in the n-type layer 604 separates from the crystal along the current path, and the resistance becomes lower than the surrounding portion. That is, a region with a lower resistance was produced in correspondence along the current path, and a current blocking region was formed around it. More specifically, low-resistance regions are formed in the cladding layers 604 and 608 above and below the active layer along the current path, and their opposite sides form current blocking regions with a high resistivity. Since current blocking regions can be made above and below the active layer, carriers can be efficiently injected into the active layer 606, and laser pulsation under a low threshold value is promised.

The voltage used in the voltage-applying process is preferably within the range from 15V to 120V. A voltage below than the range fails to activate Mg sufficiently, and a voltage above the range causes a breakdown down which results in breaking the device. The current supplying duration is preferably longer than 30 minutes.

The semiconductor laser wafer, thus obtained, is cleaved to obtain 350 μm-wide, 500 μm-long laser diode chips. When a chip, thus obtained, was operated under the current density of 5 kA/cm², and continuous pulsation of the wavelength 420 nm for the output power of 5 mW was confirmed at room temperature. The pulsation wavelength can be adjusted depending on the In composition ratio in the active layer.

When using conventional compound semiconductors containing nitrogen, especially GaN or other nitride compound semiconductors, it was difficult to fabricate p-type layers. Low energy electron beam irradiation (Japanese Patent Laid-Open Publication No. 3-218625) and thermal annealing (Japanese Patent Laid-Open Publication No. 5-183189) rely on removal of hydrogen coupled to magnesium (Mg) used as an acceptor impurity to realize p-type layers. However, these approaches need electron beam irradiation and hot annealing around 700° C. The present invention, however, not using these steps but simply applying a reverse bias to indispensable electrodes, can successfully separate hydrogen within a crystal added with an acceptor from Mg. At the same time, useless hydrogen can be removed from layers added with a donor. In this case, hydrogen separates only along a path through which the current can most easily flow. As a result, the resistance in the portion corresponding to the current path can be decreased as compared with the surrounding regions.

Therefore, according to the invention, current blocking regions can be made in both p-type and n-type cladding layers which sandwich the active layer. In a light emitting device, such as semiconductor laser, having upper and lower current blocking regions, confinement of a current into the active layer is easy, and transverse mode control is possible. Additionally, since current blocking regions can behave as light absorption layer, self-pulsation can be induced by optimizing the device structure.

(Seventh Embodiment)

Figure 7:
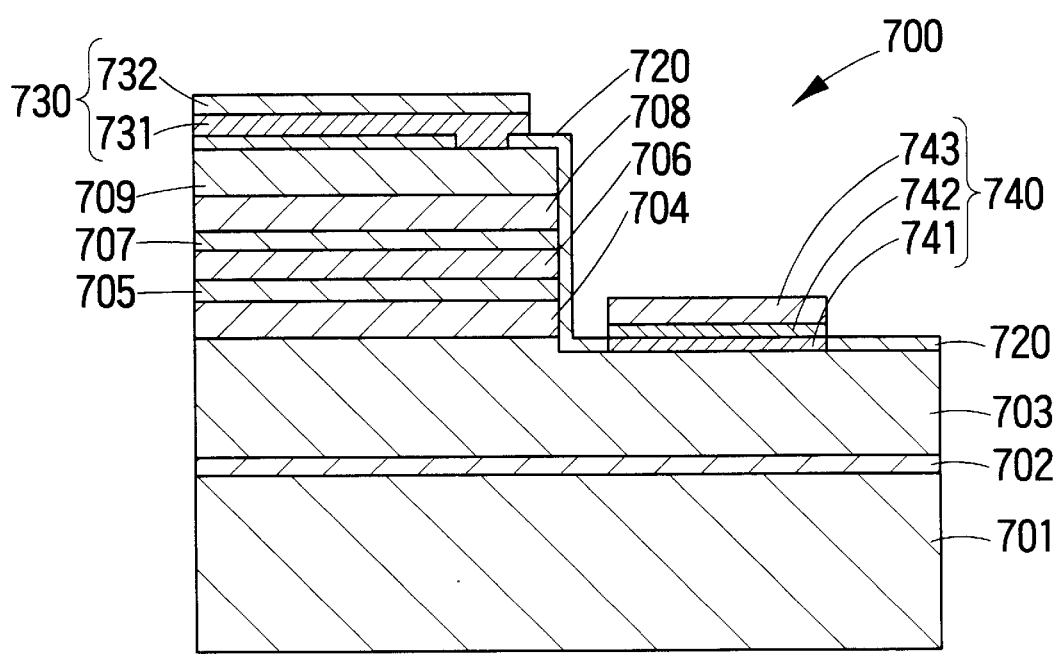
FIG. 7 is a diagram showing a cross-sectional structure of a nitride compound semiconductor light emitting device according to the seventh embodiment of the invention.
Figure 8:
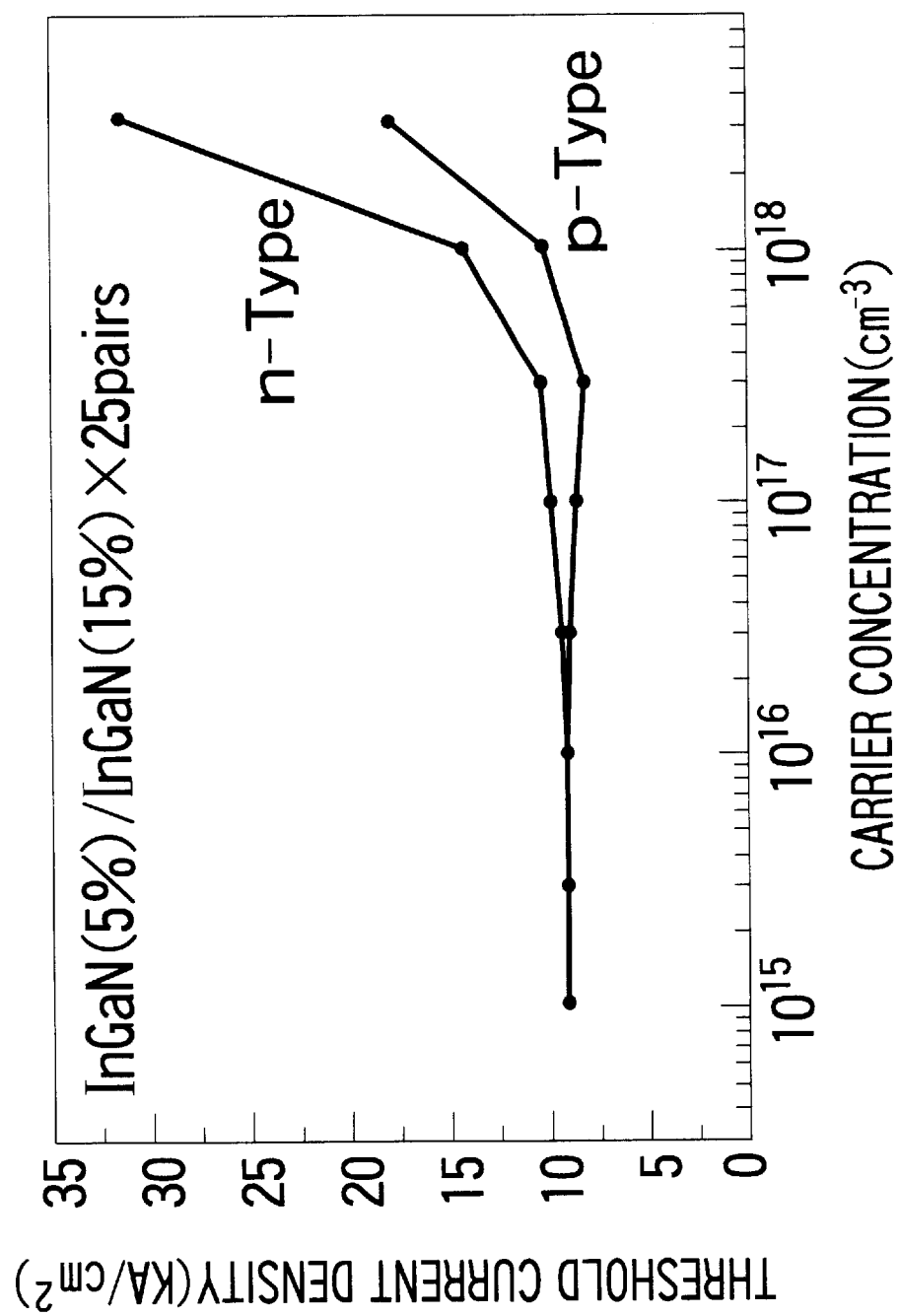
FIG. 8 is a diagram showing changes in threshold current density with carrier concentration.

FIG. 7 is a cross sectional view showing a construction of a semiconductor laser 700 taken as the seventh embodiment of the invention. This embodiment uses a unique three-layered structure as the n-side electrode to obtain excellent ohmic contact with the n-type contact layer and to promise good wire bonding to the n-side electrode. The intermediate layer in the three-layered structure suppresses the upper and lower layers from mixing to ensure their respective expected behaviors.

That is, a subject matter of the present invention lies in that a first layer 741 connected to an n-type contact layer 709 is a layer mainly containing one of metals selected from aluminum (Al), silver (Ag) and copper (Cu), that a second layer 742 in direct contact with the first layer 741 is interposed, which mainly contains a metal selected from platinum (Pt), palladium (Pd), chromium (Cr), molybdenum (Mo) and tungsten (W), and that and a third layer as the top surface mainly contains a metal selected from gold (Au) and aluminum (Al).

The semiconductor laser 700 has a sapphire substrate 701 having a c-plane as its major surface, and stacked on the sapphire substrate 701 is a 50 nm-thick GaN buffer layer 702. Stacked on the buffer layer 702 is a 4 μm-thick n-type contact layer 702 made of Si-doped GaN to the carrier concentration of $2 \times 10^{18}$ cm$^{-3}$. Further stacked on a part of the n-type contact layer 703 excepting a region for an n-type electrode 740 are a 0.5 μm-thick n-type cladding layer 704 made of Si-doped AlGaN to the carrier concentration of $1 \times 10^{18}$ cm$^{-3}$ (Al composition ratio of 8%), 0.3 μm-thick n-type guide layer 705 made of Si-doped GaN to the carrier concentration of $1 \times 10^{17}$ cm$^{-3}$, multi-quantum well (MQW) active layer 706 made of five pairs of 2 nm-thick InGaN barrier layers having the In composition ratio of 4% and 4 nm-thick InGaN well layers having the In composition ratio of 18%, 0.3 μm-thick p-type guide layer 707 made of Mg-doped GaN to the carrier concentration of $1 \times 10^{17}$ cm$^{-3}$, 0.5 μm-thick p-type cladding layer 708 made of Mg-doped AlGaN by the carrier concentration of $2 \times 10^{17}$ cm$^{-3}$ (Al composition ratio of 8%), and 0.3 μm-thick p-type contact layer 709 made of Mg-doped GaN to the carrier concentration of $3 \times 10^{17}$ cm$^{-3}$, in the described sequence.

An SiO$_2$ film 720 having a 5 μm-wide opening is formed on the p-type contact layer 709. Through the opening, the p-side electrode 730 is connected to the p-type contact layer 709. The p-side electrode 730 has a two-layered structure including a 50 nm-thick nickel (Ni) layer 731 and a 2 μm thick gold (Au) layer 732.

An n-side electrode 740 is formed on the n-type contact layer 703. The n-side electrode 740 has a three-layered structure including a first layer 741 in contact with the n-type contact layer 703, a second layer 742 overlying the first layer 741, and a third layer 743 overlying the second layer and connected to a wire (not shown), for example.

Any of aluminum (Al), silver (Ag) and copper (C) can be used as the material of the first layer 741. The first layer 741 may be a 300 nm-thick aluminum (Al) layer, for example.

Any of platinum (Pt), palladium (Pd), chromium (Cr), molybdenum (Mo) and tungsten (W) can be used as the material of the second layer 742. The second layer may be a 50 nm-thick, platinum (Pt) layer, for example.

Gold (Au) or aluminum (Al) can be used as the third layer 743. The third layer 743 may be a 1.5 μm-thick gold (Au) layer, for example.

In this embodiment, the first layer 741 forming the n-side side electrode 740 makes good ohmic contact with the n-type contact layer, and the third layer 743 promises good wire bonding. The interposed second layer 742 prevents the upper and lower layers from mixing, and maintains them operative for their intended behaviors.

Next explained is a digest of a method for manufacturing the semiconductor laser 700. Metal-organic chemical vapor deposition is used for fabrication of the semiconductor laser 700. Gases and steps used for growth of respective layers are substantially the same as those explained with the sixth embodiment, and detailed explanation thereof is omitted here.

After layers up to the p-type GaN contact layer 709 are grown in the process explained above, an SiO$_2$ film (not shown) is stacked to the thickness of 0.5 μm by thermal CVD, for example. Then the product is masked by a resist, for example. The SiO$_2$ film (not shown) is next etched by photo etching, for example, into an approximately 150 μm-wide stripe, and the portion not covered by the SiO$_2$ film is etched by using chlorine gas, for example, until exposing the n-type GaN layer 703.

After that, the SiO$_2$ film is stacked, and an approximately 10 μm-wide stripe-shaped opening is formed on the p-type GaN contact layer 709 by photo etching, for example. Stacked into the opening are 50 nm-thick Ni and 2 μm-thick Au by vacuum evaporation, for example, to form the p-side electrode 730.

Next formed on the n-type GaN contact layer 703 is the three-layered n-side electrode 740 including, for example, a 300 nm-thick Al layer 741, 50-nm thick Pt layer 742 and 1.5 µm-thick Au layer 743 by vacuum evaporation, sputtering or other appropriate process.

An n-side electrode actually prepared in the described process had the contact resistance of $10^{-4}$ $\Omega cm^2$, and no deterioration by electric conduction was observed.

The semiconductor laser wafer, thus obtained, is cleaved to obtain 350 µm-wide, 500 µm-long laser diode chips. When a chip, thus obtained, was operated under the current density of 5 kA/cm$^2$, and continuous pulsation of the wavelength 420 nm for the output power of 5 mW was confirmed at room temperature. The pulsation wavelength can be adjusted depending on the In composition ratio in the active layer.

Although the thickness of the second layer 742 in the n-side electrode is 50 nm in this embodiment, also with thinner Pt not thinner than 20 nm, substantially the same effect was obtained. Even when using Pd, Cr, Mo or W with an equivalent thickness is used instead of Pt, substantially the same effect was obtained.

In order to quantitatively confirm the effect of the semiconductor light emitting device according to the embodiment, the Inventors made estimation by comparing semiconductor light emitting devices having different electrode structures prepared as samples. These comparative samples have semiconductor stacked structures substantially the same as that shown in FIG. 7, and each of their n-side electrodes has a 300 nm-thick Al layer, 50 nm-thick Ti layer, 1.5 µm-thick Au layer in the order from the side of the n-type contact layer. In the examples prepared, the contact resistance of the n-side electrode was $10^{-3}$ $\Omega cm^2$ and higher by approximately 10 times than that of the semiconductor light emitting device according to the embodiment. Additionally, a further increase in resistance value by electric conduction and a deterioration thereby were observed in the samples. In contrast, in the semiconductor light emitting device according to the embodiment, the resistance value did not increase even during and after continuous electric conduction, and realization of a remarkably stable low-resistance was confirmed.

Additionally tried was wire bonding on the comparative examples and devices according to the embodiment. As a result, devices according to the embodiment certainly exhibited a high wire bonding yield, and a wire-pull test also resulted in proving superiority of devices according to the embodiment.

Another estimation was made by the Inventors on samples with various n-side electrodes proposed by the embodiment. One of the samples was prepared by using Ag for the first electrode 741 in the n-side electrode 740 from the side of the n-type contact layer 709, Pt for the second layer 742 and Au for the third layer 743. The lifetime of this device was improved by approximately 20% from the view point of electrode deterioration, due to the use of Ag less subject to oxidization than Al as the material of the first layer 741, as compared with a device using Al for the first layer 741.

Regarding the improvement of the lifetime, substantially the same effect was obtained also when using Cu instead of Ag as the first layer 741. When using Cu as the first layer 741, the resistance value was reduced into a half as compared with a sample using Al.

The Inventors next employed an alloy made by mixing Si around 1% with Al to form the first layer 741. By bringing the alloy layer into contact, the contact resistance can be further reduced. In this specific example, by adding Si around 1% to Al, the contact resistance was reduced into a half, approximately. However, with an excessive additive amount of Si, the contact resistance did not decrease, and when adding Si more than 20%, no decrease in contact resistance was observed. Although a decrease in resistance value was observed also when using tin (Sn), the range of the effective additive amount was 10% or less.

On the other hand, regarding the third layer 743, any metal other than Au is acceptable provided wire bonding is possible. Especially, other than Au, the use of Al is preferable.

The n-side electrode 740 need not have a three-layered structure, but may have a modified stacked structure including four or more layers by interposing one or more titanium (Ti) layers explained as a candidate of the second layer, between the second layer 742 and the third layer 743.

The n-side electrode according to the embodiment is directly applicable to light emitting devices according to the first to sixth embodiment to realize a high-performance light emitting device.

The first to seventh embodiments have been explained as using the active layer having MQW. However, active layers having less repetitive cycles, extremely having a single quantum well (SQW) structure, tend to permit less threshold current densities of lasers. In this case, however, since the light confinement effect decreases, it is recommended to approximately double the thicknesses of the guide layer and the cladding layer that the values proposed in the respective embodiments.

In the first to seventh embodiments, the active layer is undoped. However, as a result of further experiments by the Inventors, it has been confirmed that, when the active layer is a p-type layer having a carrier concentration in the range of $2 \times 10^{16}$ cm$^{-3}$ from $8 \times 10^{17}$ cm$^{-3}$, the threshold current density can be reduced more than that realized by using the undoped active layer. Therefore, the active layer is preferably a p-type layer having such a carrier concentration.

(Eighth Embodiment)

Figure 9:
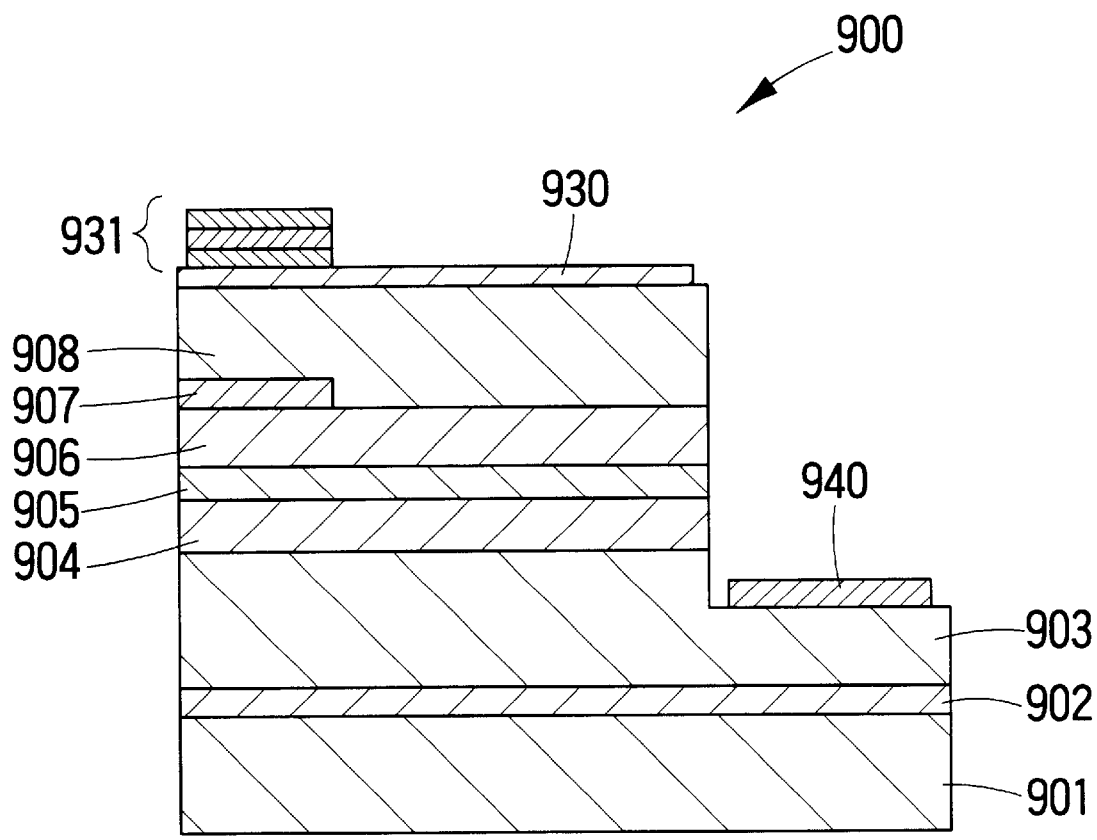
FIG. 9 is a diagram showing a cross-sectional structure of a nitride compound semiconductor light emitting device according to the eighth embodiment of the invention.

FIG. 9 is a cross-sectional view showing a construction of a light emitting diode 900 embodying the invention. The light emitting diode 900 shown here has a sapphire substrate 901 on which a light emitting layered structure is formed. The light emitting diode 900 has a TiO$_2$ layer region 907 as a current blocking region.

In the light emitting diode 900, locally stacked on the substrate 901 are a GaN buffer layer 902, n-type GaN contact layer 903, n-type AlGaN cladding layer 904, 50 nm-thick InGaN emission layer 905, p-type AlGaN cladding layer 906, and TiO$_2$ current blocking region 907, p-type GaN contact layer 908. An n-side electrode 940 is formed on the n-type contact layer 903, and a transparent electrode 930 made of ITO(indium-tin-oxide) is formed on the substantially entire surface of the p-type contact layer 908. Further formed immediately above the TiO$_2$ region is another electrode made by stacking Ni, Cr and Au in this order from the side of the ITO electrode. In the light emitting diode, thus made, the pulsation wavelength can be changed by appropriately selecting composition ratios and kinds of In or P used for the emission layer, and the embodiment enables realization of a light emitting diode in the range from the infrared band to ultraviolet band.

Also for manufacturing the light emitting diode 900, MOCVD can be used like the other embodiments, and source material gases, steps for growth and the process for making TiO$_2$ may be the same as the other embodiments. Detailed explanation thereof is therefore omitted here.

In the structure explained above, even when emission occurs immediately under the opaque Au/Cr/Ni multi-layered electrode portion, issue of the light is prevented by the electrode. When the device is configured to prevent the corresponding current from being injected to the emission layer, the current supplied for obtaining a certain emission intensity can be decreased accordingly.

The embodiment has been explained as using $TiO_2$ as the current blocking layer; however, as already explained with the other embodiments, any other compound made by replacing part of Ga in i-type GaN by B, Al or other appropriate element can be used. Note here, however, that, since no region absorbing emitted light should be formed in light emitting diodes, it is not desirable to make a region with a smaller band gap than the emission layer. Therefore, when In is added, a larger amount of B or Al is preferably added.

Although SiC, for example, can be used as the substrate in lieu of sapphire, if a substrate with an energy gap absorbing emitted light is used, a Bragg reflective mirror using a multi-layered film is preferably formed in the buffer layer portion, for example, between the substrate and the operative layer.

Although the embodiment has been explained as making the current blocking region on the emission layer 905, it is also possible to form the current blocking region in the light emitting layer itself by oxidizing part of the emission layer 905. In this case, the wafer can be removed from a growth apparatus when growth progresses to the emission layer, or can be removed after a protective film facilitating etching is formed.

Although the invention has been described by way of specific embodiments, the invention is not limited to these examples. Particular examples shown herein give corresponding effects either for semiconductors or light emitting diodes. The conduction type of each semiconductor layer shown in specific examples can be inverted.

Additionally, usable materials as the substrate are not limited to sapphire or SiC shown above, and various other materials, such as spinel, $ScAlMgO_4$, $LaSrGaO_4$ or $(LaSr)(AlTa)O_3$ insulating substrates, or MgO or Si conductive substrates, can be used in the same manner to obtain respective effects.

What is claimed is:

1. A nitride compound semiconductor light emitting device including an active layer, a current blocking layer and a contact layer, wherein said current blocking layer has an opening so that a current can be selectively injected into said active layer, said current blocking layer is interposed between said active layer and said contact layer and said current blocking layer is made of an oxide of a metal selected from the group consisting of titanium (Ti), magnesium (Mg), nickel (Ni), chromium (Cr), scandium (Sc), zinc (Zn), indium (In), tin (Sn) and tungsten (W).

2. A nitride compound semitting device having an active layer and a current blocking layer, wherein said current blocking layer has an opening so that a current can be selectively injected into said active layer and said current blocking layer is made of i-type $B_{(1-x-y-z)}In_xAl_yGa_zN$ single-crystal ($0 \leq x \leq 1$, $0 \leq y \leq 1$, $0 \leq z \leq 1$) in which carriers are inactivated by hydrogen or oxygen.

3. A nitride compound semiconductor light emitting device having an active layer and a current blocking layer, wherein said current blocking layer has an opening so that a current can be selectively injected into said active layer and said current blocking layer is made of $B_{(1-x-y-z)}In_xAl_yGa_zN$ single-crystal ($0 \leq x \leq 1$, $0 \leq y \leq 1$, $0 \leq z \leq 1$) including magnesium and oxygen.

4. The nitride compound semiconductor light emitting device according to claim 3 wherein said current blocking layer is made of $B_{(1-x-y-z)}In_xAl_yGa_zN$ single-crystal ($0 \leq x \leq 1$, $0 \leq y \leq 1$, $0 \leq z \leq 1$).

5. A nitride compound semiconductor light emitting device having a current blocking layer, wherein said current blocking layer is made of an n-type $B_{(1-x-y-z)}In_xAl_yGa_zN$ single-crystal ($0 \leq x \leq 1$, $0 \leq y \leq 1$, $0 \leq z \leq 1$) containing both a p-type impurity and an n-type impurity.

6. The nitride compound semiconductor light emitting device according to claim 5 wherein said current blocking layer is made of n-type $B_{(1-x-y-z)}In_xAl_yGa_zN$ single-crystal ($0 \leq x \leq 1$, $0 \leq y \leq 1$, $0 \leq z \leq 1$).

7. A nitride compound semiconductor light emitting device comprising:
   an electrically conductive nitride compound semiconductor layer;
   a current blocking layer stacked on said nitride compound semiconductor layer and having an opening;
   a buffer layer made of $B_{(1-x-y-z)}In_xAl_yGa_zN$ ($0 \leq x \leq 1$, $0 \leq y \leq 1$, $0 \leq z \leq 1$) stacked to cover said current blocking layer and said nitride compound semiconductor layer at said opening; and
   a layer made of $B_{(1-x2-y2-z2)}In_{x2}Al_{y2}Ga_{z2}N$ ($0 \leq x2 \leq 1$, $0 \leq y2 \leq 1$, $0 \leq z2 \leq 1$) stacked on said buffer layer.

8. The nitride compound semiconductor light emitting device according to claim 7 wherein said buffer layer has been initially stacked at a lower temperature then re-crystallized at a higher temperature.

9. The nitride compound semiconductor light emitting device according to claim 7 wherein said buffer layer has been initially stacked in an amorphous state then thereafter re-crystallized.

10. The nitride compound semiconductor light emitting device according to claim 7 wherein said buffer layer has been initially stacked in a polycrystalline state then thereafter re-crystallized.

11. The nitride compound semiconductor light emitting device according to claim 7 wherein said buffer layer is in a polycrystalline state.

12. The nitride compound semiconductor light emitting device according to claim 7 wherein said opening is stripe-shaped.

13. The nitride compound semiconductor light emitting device according to claim 7, further comprising a substrate and an active layer, and said current blocking layer being formed between said substrate and said active layer.

14. The nitride compound semiconductor light emitting device according to claim 7 wherein said current blocking layer is made of $B_{(1-x-y-z)}In_xAl_yGa_zN$ single-crystal ($0 \leq x \leq 1$, $0 \leq y \leq 1$, $0 \leq z \leq 1$) in which carriers are inactivated by hydrogen or oxygen.

15. The nitride compound semiconductor light emitting device according to claim 7 wherein said current blocking layer is $B_{(1-x-y-z)}In_xAl_yGa_zN$ ($0 \leq x \leq 1$, $0 \leq y \leq 1$, $0 \leq z \leq 1$) containing both a p-type impurity and an n-type impurity.

16. A nitride compound semiconductor light emitting device comprising:
   a substrate;
   a first buffer layer stacked on said substrate;
   an electrically conductive layer stacked on said buffer layer and made of $B_{(1-x1-y1-z1)}In_{x1}Al_{y1}Ga_{z1}N$ ($0 \leq x1 \leq 1$, $0 \leq y1 \leq 1$, $0 \leq z1 \leq 1$);
   a current blocking layer stacked on said electrically conductive layer and having an opening;

a second buffer layer stacked to cover said current blocking layer and said electrically conductive layer at said opening, said second buffer layer being made of a $B_{(1-x2-y2-z2)}In_{x2}Al_{y2}Ga_{z2}N$ ($0 \leq z2 \leq 1$, $0 \leq y2 \leq 1$, $0 z2 \leq 1$); and an active layer stacked on said second buffer layer and made of $B_{(1-x3-y3-z3)}In_{x3}Al_{y3}Ga_{z3}N$ ($0 \leq x3 \leq 1$, $0 \leq y3 \leq 1$, $0 \leq z3 \leq 1$).

17. The nitride compound semiconductor light emitting device according to claim 16, wherein said current blocking layer is made of an oxide of a metal selected from the group consisting of titanium (Ti), magnesium (Mg), nickel (Ni), chromium (Cr), scandium (Sc), zinc (Zn), indium (In), tin (Sn) and tungsten (W).

18. The nitride compound semiconductor light emitting device according to claim 16, wherein said current blocking layer is made of i-type $B_{(1-x-y-z)}In_xAl_yGa_zN$ single-crystal layer ($0 \leq x \leq 1$, $0 \leq y \leq 1$, $0 \leq z \leq 1$) in which carriers are inactivated by hydrogen or oxygen.

19. The nitride compound semiconductor light emitting device according to claim 16, wherein said current blocking layer is made of i-type $B_{(1-x-y-z)}In_xAl_yGa_zN$ single-crystal layer ($0 \leq z \leq 1$, $0 \leq y \leq 1$, $0 \leq z \leq 1$) including a p-type impurity.

* * * * *